United States Patent
Moll et al.

(10) Patent No.: US 7,037,777 B2
(45) Date of Patent: May 2, 2006

(54) PROCESS FOR PRODUCING AN ETCHING MASK ON A MICROSTRUCTURE, IN PARTICULAR A SEMICONDUCTOR STRUCTURE WITH TRENCH CAPACITORS, AND CORRESPONDING USE OF THE ETCHING MASK

(75) Inventors: Hans-Peter Moll, Dresden (DE); Momtchil Stavrev, Dresden (DE); Mirko Vogt, Dresden (DE); Stephan Wege, Weissig (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 10/801,781

(22) Filed: Mar. 16, 2004

(65) Prior Publication Data

US 2004/0203238 A1 Oct. 14, 2004

(30) Foreign Application Priority Data

Mar. 19, 2003 (DE) .................................. 103 12 202

(51) Int. Cl.
*H01L 21/8242* (2006.01)

(52) U.S. Cl. ...................................... 438/244; 438/248
(58) Field of Classification Search ............... 438/244, 438/248
See application file for complete search history.

(56) References Cited

U.S. PATENT DOCUMENTS

| 5,378,316 A | | 1/1995 | Franke et al. | |
|---|---|---|---|---|
| 6,013,937 A | * | 1/2000 | Beintner et al. | ............ 257/513 |
| 6,204,112 B1 | * | 3/2001 | Chakravarti et al. | ........ 438/243 |
| 6,809,368 B1 | * | 10/2004 | Divakaruni et al. | ........ 257/302 |

FOREIGN PATENT DOCUMENTS

| DE | 198 44 102 C2 | 4/2000 |
|---|---|---|
| DE | 199 58 904 C2 | 6/2001 |
| DE | 100 00 003 C2 | 7/2001 |
| EP | 0932187 A2 | 7/1999 |

* cited by examiner

*Primary Examiner*—Chandra Chaudhari
(74) *Attorney, Agent, or Firm*—Jenkins, Wilson, Taylor & Hunt, P.A.

(57) ABSTRACT

Process for producing an etching mask on a microstructure, in particular a semiconductor structure with trench capacitors, and corresponding uses of the etching mask which allow for extremely thin photoresist layers to be employed.

12 Claims, 6 Drawing Sheets

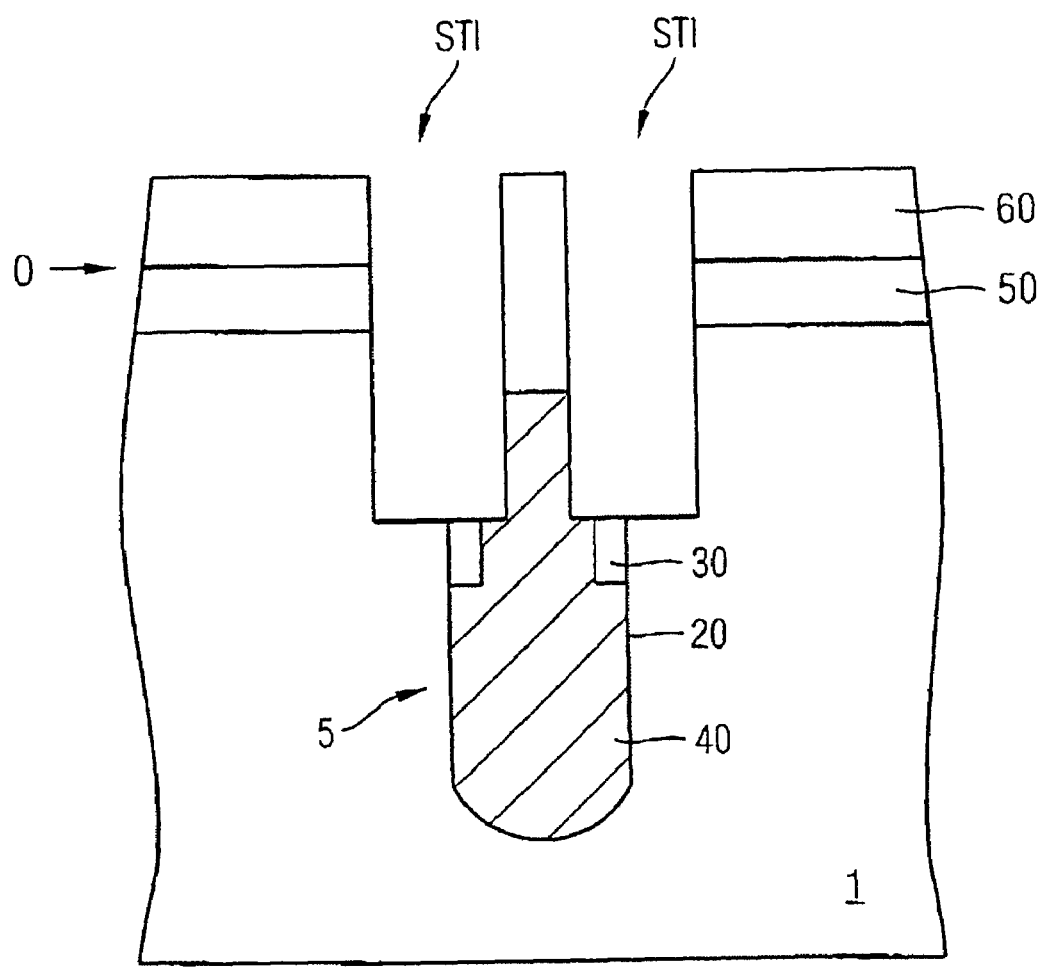

PROCESS FOR PRODUCING AN ETCHING MASK ON A MICROSTRUCTURE, IN PARTICULAR A SEMICONDUCTOR STRUCTURE WITH TRENCH CAPACITORS, AND CORRESPONDING USE OF THE ETCHING MASK

TECHNICAL FIELD

The present invention relates to a process for producing an etching mask on a microstructure, in particular a semiconductor structure with trench capacitors, and to a corresponding use of the etching mask.

BACKGROUND ART

In the text which follows, the term microstructure is to be understood as meaning both microelectronic and micromechanical structures.

Although they can in principle be applied to any desired integrated circuits, the present invention and the problems on which it is based are explained with reference to integrated memory circuits in silicon technology.

Introduction of the 110 nm memory technology and most recently introduction of the 90 nm memory technology are associated with the lithography being switched over to the 193 nm generation in order to enable the extremely small features required to be reproduced.

According to the Rayleigh criterion, the introduction of ever shorter wavelengths leads to a restriction in the focus depth, and therefore it is necessary to use extremely thin photoresist layers of the order of magnitude of 100 nm and wafer surfaces which are as planar as possible in front of the respective lithography plane.

In particular the patterning of active areas in DRAM technologies by means of an STI (Shallow Trench Isolation) etch with a minimum feature size of 90 nm and below imposes severe demands, since the problem of patterning using the ever smaller photoresist thicknesses cannot be solved adequately using conventional solution approaches.

SUMMARY OF THE INVENTION

One possible way of alleviating the problem provides for the use of either one or two hard masks, which are patterned by means of separate hard-mask etching processes before the STI main etch is carried out. The main drawback of a variant of this type using a hard mask, e.g. made from silicon oxide, is the photoresist budget deficit to allow the patterning of a sufficiently thick hard mask to be carried out with accurate dimensioning. To avoid this drawback, double hard-mask concepts, e.g. a polysilicon hard mask with a silicon oxide mask below it, have been considered, but are characterized by a high degree of complexity, i.e. a plurality of deposition and etching steps, and accordingly high costs.

The object of the present invention consists in providing a process for producing an etching mask on a microstructure, in particular a semiconductor structure with trench capacitors, and corresponding uses, which allow extremely thin photoresist layers to be employed.

According to the invention, this object is achieved by the production process described in Claim 1.

The idea on which the invention is based provides for the deposition of three hard-mask layers on the microstructure which is to be patterned. In terms of the etching selectivity, these layers can be configured in such a manner that the middle hard-mask layer has an etching rate which is comparable to that of photoresist, and the bottom and top hard-mask layers have a virtually identical etching rate. In addition, it is expedient if the middle hard-mask layer can be etched with a very high selectivity with respect to the top hard-mask layer. The top hard-mask layer is significantly thinner than the middle and lower hard-mask layers, so that patterning can be carried out with a very thin resist mask.

By way of example, a layer combination of borosilicate glass as the bottom hard-mask layer, amorphous hydrogen-containing carbon (a-C:H) as the middle hard-mask layer and SiON as the top hard-mask layer satisfies all the required conditions.

One particular advantage of the process according to the invention is the possibility of in this way altering the lateral dimension of the active areas by etching technology without the profile of the hard masks below being influenced.

The introduction of three hard-mask layers with selectivity ratios which are matched to one another and to the photoresist makes it possible to simplify the overall process and to use existing plasma-etching installations, in which all the patterning processes for the three hard-mask layers can be carried out sequentially. In addition, the process window is significantly widened, so that dimensionally accurate STI patterning for future technology generations can be ensured.

The subclaims give advantageous refinements and improvements to the production process described in Claim 1.

According to one preferred refinement, an antireflection coating is provided between the third hard-mask layer and the photoresist mask, which antireflection coating is patterned prior to the patterning of the third hard-mask layer by etching chemistry using the photoresist mask and is removed during the patterning of the second hard-mask layer by etching chemistry using the patterned third hard-mask layer.

According to a further preferred refinement, the first hard-mask layer consists of borosilicate glass.

According to a further preferred refinement, the second hard-mask layer consists of a carbon-containing material, in particular of amorphous C:H.

According to a further preferred refinement, the third hard-mask layer consists of silicon oxynitride.

According to a further preferred refinement, the second and third hard-mask layers are such that they can be patterned by etching chemistry with a selectivity of greater than 100:1, in particular greater than 200:1.

According to a further preferred refinement, the patterning of the first, second and third hard-mask layers by etching chemistry is carried out sequentially in the same plasma-etching chamber.

According to a further preferred refinement, the first and second hard-mask layers have a thickness of from 100 to 400 nm, in particular from 200 to 300 nm.

According to a further preferred refinement, the third hard-mask layer has a thickness of from 10 to 40 nm, in particular from 20 to 30 nm.

According to a further preferred refinement, the photoresist mask has a thickness of less than or equal to 150 nm.

According to a further preferred refinement, the microstructure is a semiconductor structure with one or more trench capacitors, on which there is a further hard mask for the prior fabrication of the trench capacitor(s), with filling of a capacitor filling, which is recessed with respect to the surface, of the trench capacitor(s) being completed during the provision of the first hard-mask layer.

A preferred use of the etching mask which has been produced in accordance with the invention are given in Claim 12.

BRIEF DESCRIPTION OF THE DRAWINGS

An exemplary embodiment of the invention is illustrated in the drawings and explained in more detail in the description which follows, in which:

FIGS. 1a–f diagrammatically depict successive process stages involved in a process for producing an etching mask on a microstructure, in particular a semiconductor structure, as an embodiment of the present invention.

DETAILED DESCRIPTION OF THE INVENTION

In the figures, identical reference symbols denote identical or functionally equivalent components.

Figure 1A:
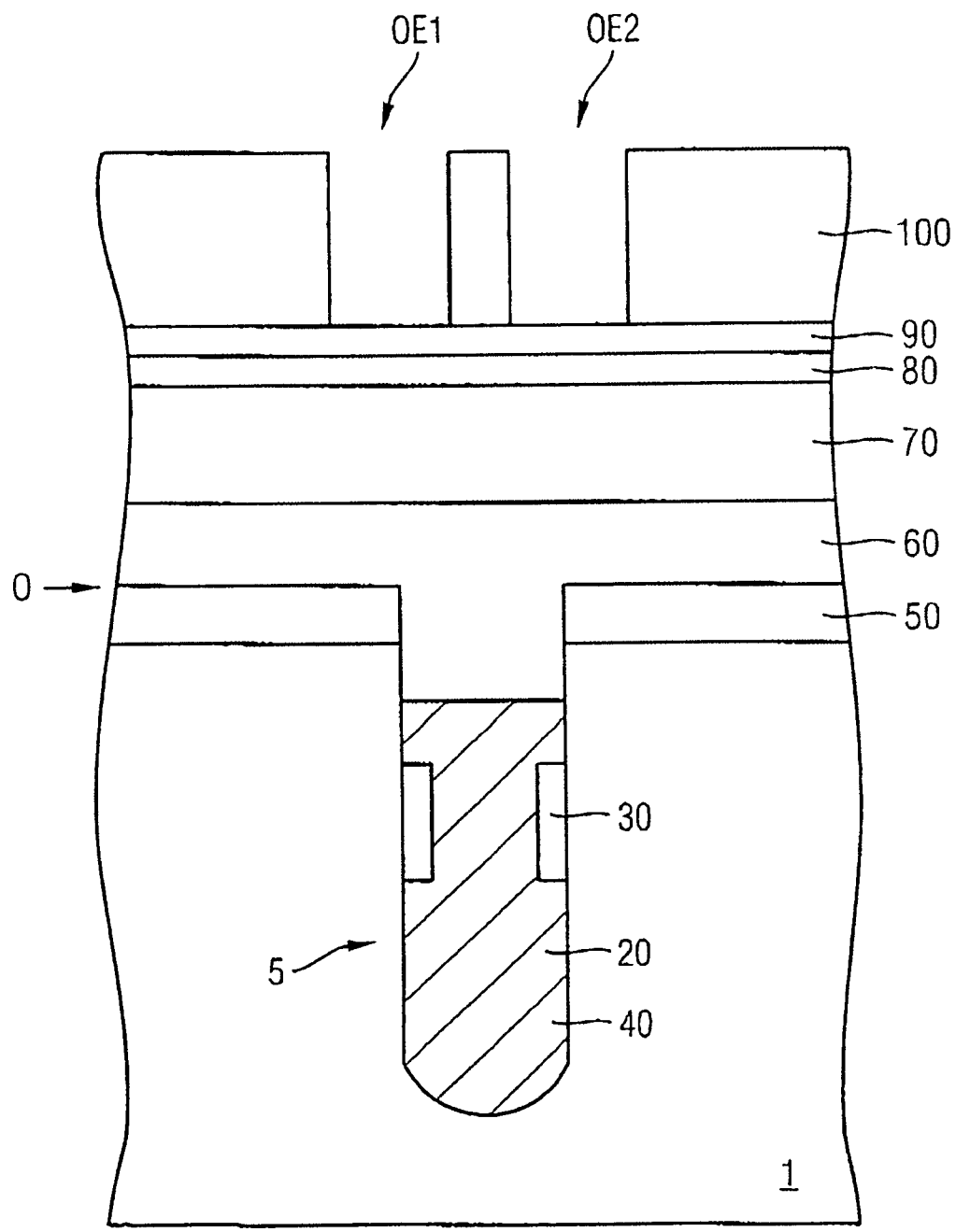

In FIG. 1a, reference numeral 1 denotes a silicon semiconductor substrate, in which a trench capacitor 5 of a semiconductor memory device (not illustrated in more detail) is provided. The trench capacitor 5 has a conductive filling 40, which is insulated from the surrounding substrate by a capacitor dielectric 20. In the upper region of the trench capacitor 5 there is an insulation collar 30, above which the trench capacitor 5 is connected to the semiconductor substrate 1 for connection to a select transistor (not shown).

Starting from the process state in which the conductive capacitor filling 40 has been recessed into the substrate 1 with respect to the surface of a hard mask 50 made from silicon nitride, the production of the etching mask in accordance with the exemplary embodiment begins.

In this context, it should be noted that the hard-mask 50 made from silicon nitride has previously been used for fabrication of the trench capacitor 5 and/or its filling 40 and its insulation collar 30.

In a first step, a layer of borosilicate glass is deposited on a surface O of the hard mask 50 made from silicon nitride and the recessed trench capacitors 5 in order to level the surface, this layer simultaneously also serving as the first hard-mask layer 60. The first hard-mask layer 60 in this case has a thickness of from approx. 200 nm to 300 nm above the surface O of the hard mask 50.

Next, a second hard-mask layer 70 of amorphous, hydrogen-containing carbon (a-C:H) with a thickness of likewise 200 nm to 300 nm is deposited over the resulting structure.

Finally, silicon oxynitride with a thickness of from 20 nm to 30 nm is deposited over the second hard-mask layer 80, as third hard-mask layer 80.

In this exemplary embodiment, an antireflection coating 90, which is in itself optional, is also provided on the top, third hard-mask layer 80.

Then, a photoresist mask 100 with a thickness of approximately 100 nm, which has openings OE1, OE2 which in each case overlap part of the trench capacitor 5 and of the adjacent hard mask 50, is formed on the resulting structure.

Figure 1B:
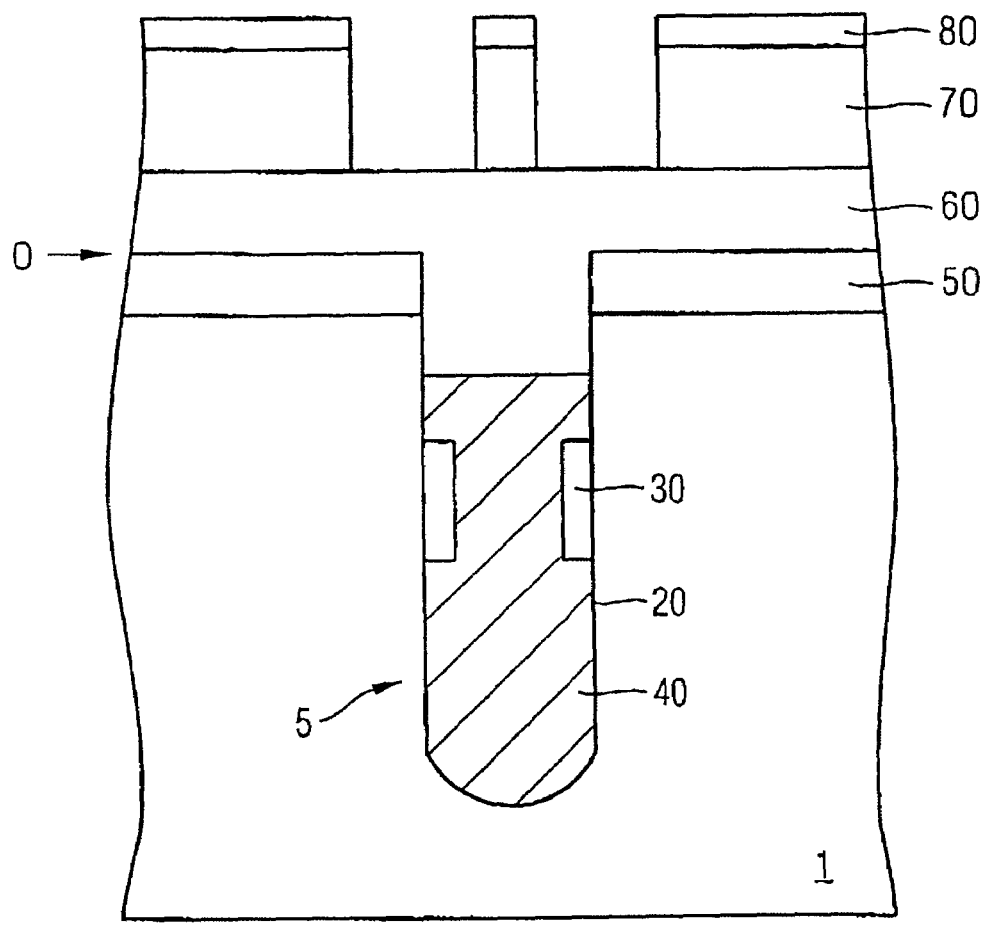

Then, as shown in FIG. 1b, an etching step is carried out using a fluorine-containing etching plasma in an etching chamber, in order to pattern the antireflection coating 90 and the third hard-mask layer 80 below it in a pattern corresponding to the openings OE1, OE2 by means of the photoresist mask 100. Then, likewise referring to FIG. 1b, an etching step is carried out using the patterned third hard mask as the mask, in order to pattern the second hard-mask layer 70 below it in a pattern which matches the openings OE1, OE2. In this second working step, which takes place immediately after the first etching step, in the same etching chamber, an $O_2/N_2$ plasma is used to etch the middle hard-mask layer 70. In this plasma-etching step, in addition to the middle hard-mask layer 70 being patterned, the photoresist mask 100 and the patterned antireflection coating 90 below it are removed.

Figure 1C:
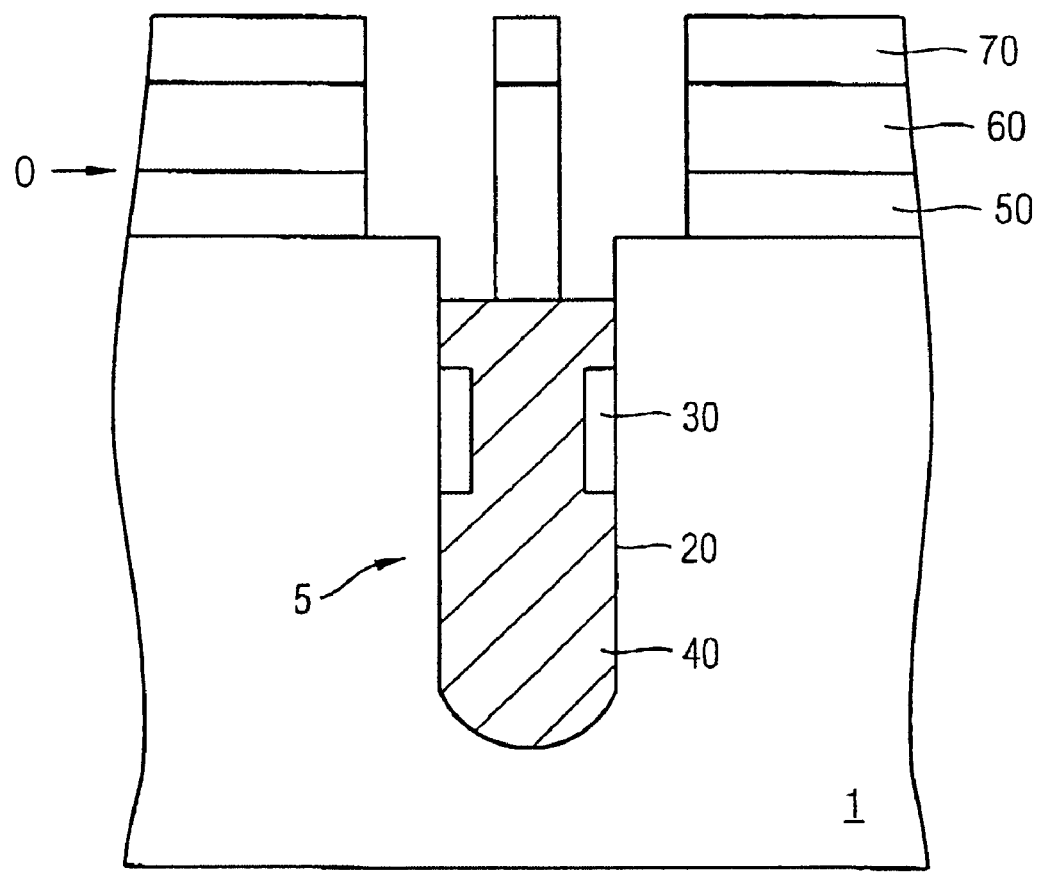

Then, referring now to FIG. 1c, a fluorine-containing plasma is once again applied to the resulting structure in the plasma-etching chamber, which leads firstly to the bottom hard-mask layer 60 being patterned in a pattern which corresponds to the openings OE1, OE2, together with the uncovered hard-mask layer 50 made from silicon nitride below it, while at the same time part of the middle hard-mask layer 70 made from amorphous, hydrogen-containing carbon is consumed. This etching process stops at the semiconductor substrate 1 and the electrically conductive filling 40 in the trench capacitor 5.

Figure 1D:
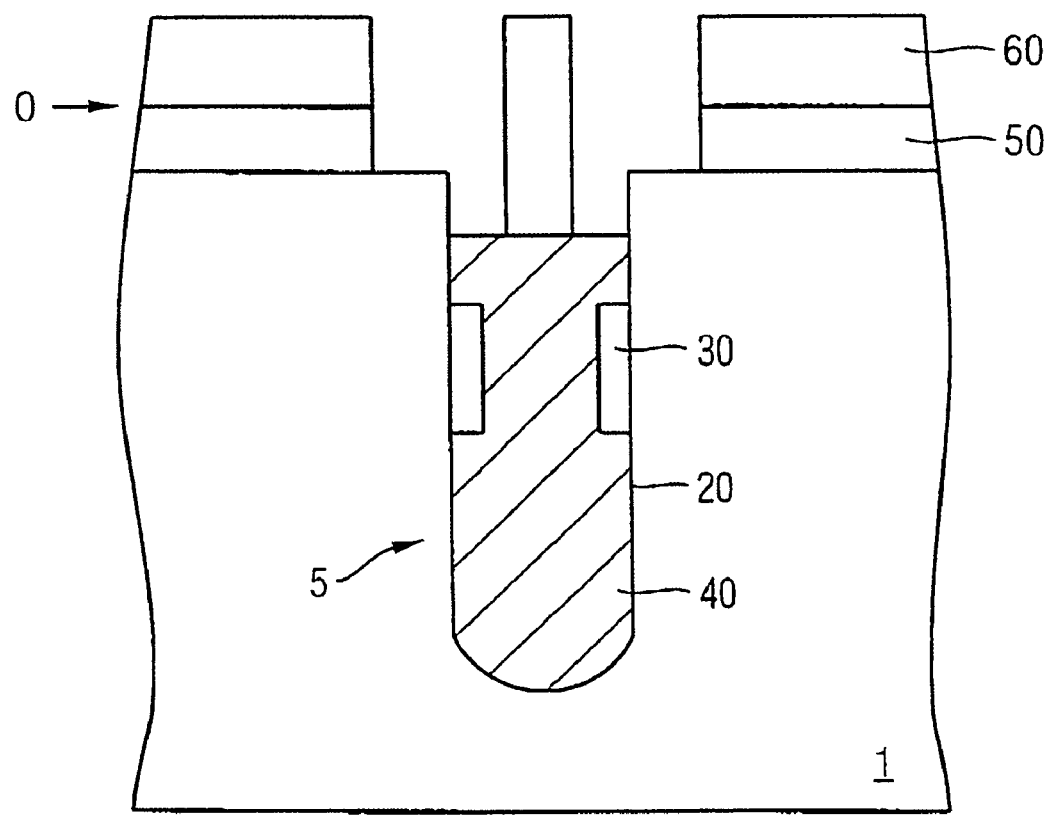

Referring now to FIG. 1d, a further etching step is carried out in an $O_2/N_2$ plasma in the same etching chamber in order to remove the remainder of the second hard-mask layer 70 from the resulting structure.

As shown in FIG. 1e, the etching of isolation trenches STI is then carried out in a pattern which matches the openings OE1, OE2 which have been transferred to the bottom hard-mask layer 60, these isolation trenches extending into the isolation trench region of the trench capacitor 5 and the surrounding semiconductor substrate 1.

Figure 1F:
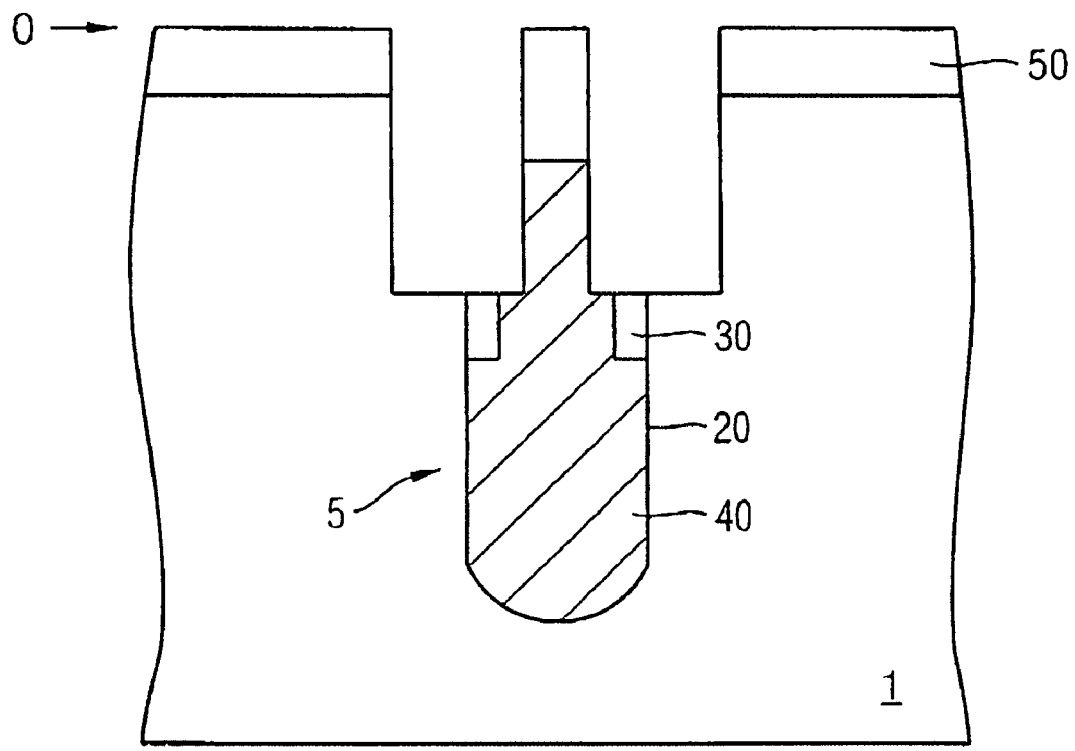

Finally, referring now to the process state shown in FIG. 1f, the remaining, bottom hard-mask layer 60 is removed in a fluorine-containing plasma in the same etching chamber.

The steps which follow the process state shown in FIG. 1f are well known from the prior art and include, inter alia, deposition of an insulating filling material over the isolation trenches STI and polishing back the insulating filling material to the surface O of the hard mask 50 made from silicon nitride.

Although the present invention has been explained on the basis of a preferred exemplary embodiment, it is not restricted thereto, but rather can be varied in numerous ways.

In particular, the choice of materials mentioned for the first, second and third hard-mask layers and the choice of the etching plasmas are only examples and can be varied in numerous ways.

Also, the present invention is not restricted to the microstructure in the form of trench capacitors which is illustrated, but rather can be applied to any desired microelectronic and micromechanical microstructures.

LIST OF REFERENCE SYMBOLS

1 Silicon semiconductor substrate
5 Trench capacitor
20 Capacitor dielectric
30 Insulation collar
40 Capacitor filling
50 Silicon nitride layer
60 First hard-mask layer, e.g. borosilicate glass
70 Second hard-mask layer, e.g. amorphous C:H
80 Third hard-mask layer, e.g. SiON
90 Antireflection coating
100 Photoresist mask
O Surface
STI Isolation trenches
OE1, OE2 Openings in the photomask 100

What is claimed is:

1. Process for producing an etching mask on a microstructure, in particular a semiconductor structure with one or more trench capacitors, which includes the following steps:

(a) providing a lower first, a middle second and an upper third hard-mask layer on a surface of the microstructure, the third hard-mask layer being significantly thinner than the first and second hard-mask layers;
(b) providing a photoresist mask above the third hard-mask layer;
(c) patterning the third hard-mask layer by etching chemistry using the photoresist mask;
(d) patterning the second hard-mask layer by etching chemistry using the patterned third hard-mask layer, with the photoresist mask being removed at the same time;
(e) patterning the first hard-mask layer by etching chemistry using the patterned second hard-mask layer, with the third hard-mask layer being removed at the same time; and
(f) removing the patterned second hard-mask layer.

2. Process according to claim 1, wherein an antireflection coating is provided between the third hard-mask layer and the photoresist mask, which antireflection coating is patterned prior to the patterning of the third hard-mask layer by etching chemistry using the photoresist mask and is removed during the patterning of the second hard-mask layer by etching chemistry using the patterned third hard-mask layer.

3. Process according to claim 1, wherein the first hard-mask layer consists of borosilicate glass.

4. Process according to claim 1, wherein the second hard-mask layer consists of a carbon-containing material, in particular of amorphous C:H.

5. Process according to claim 1, wherein the third hard-mask layer consists of silicon oxynitride.

6. Process according to claim 1, wherein the second and third hard-mask layers are such that they can be structured by etching chemistry with a selectivity of greater than 100:1, in particular greater than 200:1.

7. Process according to claim 1, wherein the patterning of the first, second and third hard-mask layers by etching chemistry is carried out sequentially in the same plasma-etching chamber.

8. Process according to claim 1, wherein the first and second hard-mask layers have a thickness of from 100 to 400 nm, in particular from 200 to 300 nm.

9. Process according to claim 8, wherein the third hard-mask layer has a thickness of from 10 to 40 nm, in particular from 20 to 30 nm.

10. Process according to claim 1, wherein the photoresist mask has a thickness of less than or equal to 150 nm.

11. Process according to claim 1, wherein the microstructure is a semiconductor structure with one or more trench capacitors, on which there is a further hard mask for the prior fabrication of the trench capacitor(s), with filling of a capacitor filling, which is recessed with respect to the surface, of the trench capacitor(s) being completed during the provision of the first hard-mask layer.

12. Use of an etching mask produced using the process according to claim 11 for the fabrication of isolation trenches for isolating the trench capacitors, patterning of the further hard mask by etching chemistry for the preceding fabrication of the trench capacitor(s) taking place after the patterning of the first hard-mask layer by etching chemistry using the patterned second hard-mask layer and recessing of the first hard-mask layer in regions down to the recessed capacitor filling of the trench capacitor(s).

* * * * *